United States Patent [19]

Kenmotsu

[11] Patent Number: 5,399,530
[45] Date of Patent: Mar. 21, 1995

[54] METHOD OF FORMING INTERCONNECTION STRUCTURE TO PREVENT OUTGASSING

[75] Inventor: Hidenori Kenmotsu, Tokyo, Japan

[73] Assignee: Sony Corporation, Tokyo, Japan

[21] Appl. No.: 78,103

[22] Filed: Jun. 18, 1993

[30] Foreign Application Priority Data

Jun. 18, 1992 [JP] Japan ................................. 4-159058

[51] Int. Cl.⁶ ............................................. H01L 21/44
[52] U.S. Cl. ..................................... 437/195; 437/190
[58] Field of Search ............... 437/231, 190, 194, 195; 204/192.3

[56] References Cited

U.S. PATENT DOCUMENTS 4,755,480  7/1988  Yau et al. ............................. 437/190
5,081,064  1/1992  Inoue et al. .......................... 437/194

FOREIGN PATENT DOCUMENTS 2-151052  6/1990  Japan ................................. 437/231

OTHER PUBLICATIONS

Wolf, *Silicon Processing for the VLSI Era*, vol. 2, Lattic Press, Sunset Beach, Calif., 1990, pp. 229–236, 280–281.
Tompkins et al., "Desorption from Spin-On Glass," J. Electrochem. Soc., vol. 136, No. 8, Aug. 1989, pp. 2331–2335.
Nishida et al., "Multilevel Interconnection for Half-Micron ULSI's," VMIC Conference, 1989 IEEE, Jun. 12–13, 1989, pp. 19–25.
J. L. Vossen, "A Sputtering Technique for Coating the Inside Walls of Through-Holes in Substrates", J. Vac. Sci. Technol., vol. 11, No. 5, Sep./Oct. 1974, pp. 875–877

*Primary Examiner*—Brian E. Hearn
*Assistant Examiner*—Lynne A. Gurley
*Attorney, Agent, or Firm*—Hill, Steadman & Simpson

[57] ABSTRACT

The disclosure relates to a method of forming an interconnection structure. In the method, firstly, a SOG layer is deposited on a first aluminum conductive layer which is formed on a substrate. Then, a through-hole is formed by opening the SOG layer so as to expose two opposed surfaces of the SOG layer and an upper surface of the first conductive layer. Then, the substrate, the first conductive layer and the SOG layer are heated at a first temperature ranging from 450° to 550° C. Then, a titanium layer is formed on the through-hole so as to mask the two opposed surfaces of the SOG layer. Then, a second aluminum conductive layer is deposited on the SOG layer by sputtering so as to fill the through-hole with the second conductive layer. During the sputtering of the second conductive layer, the release of water vapor from the SOG layer is suppressed, thereby obtaining an interconnection structure having a good contact.

5 Claims, 3 Drawing Sheets

METHOD OF FORMING INTERCONNECTION STRUCTURE TO PREVENT OUTGASSING

BACKGROUND OF THE INVENTION

1. Field of the Invention

The present invention relates in general to a method of forming an interconnection structure, and more particularly to a method of forming a multilayer interconnection structure.

2. Description of the Prior Art

With the progress of large-scale integration, requirements for an insulating film for planarization has become more strict. Hitherto, a spin-on glass (SOG) film has been used as an insulating film between aluminum conductive layers for the purpose of planarization. However, a SOG film has a very high moisture-absorbing characteristic as compared with other oxide films formed by chemical vapor deposition (CVD) method. Therefore, when a SOG film is exposed to the atmosphere, it adsorbs a large amount of moisture. If a cure after the SOG film coating is insufficient, water vapor is released from a SOG film upon heating after the cure. This tends to lower reliability of the device.

With reference to FIG. 9, a conventional method of forming a multilayer interconnection structure will be described.

Firstly, a first aluminum conductive layer 10 is formed on a substrate 12. Then, a first phosphorus-doped silicon dioxide (P—$SiO_2$) layer 14, a SOG layer 16 and a second P—$SiO_2$ layer 18 are formed in turn by the plasma CVD method on the first aluminum layer 10 so as to form a multilayer structure. Then, a through hole 20 is formed on the multilayer structure so as to expose an upper surface of the first aluminum layer 10. Then, the multilayer structure is heated for the purpose of the formation of a second aluminum conductive layer (not shown). However, as is shown by arrows of FIG. 9, water vapor is released into the through hole 20 from the SOG layer 16 by this heating. This water vapor oxidizes the exposed upper surface of the first aluminum layer 10, thereby forming thereon aluminum oxide. In the worst case, a void space is formed by the released water vapor in the through hole 20 after the through hole 20 is filled with the second aluminum layer. This leads to an insufficient ohmic contact between the first and second aluminum conductive layers.

SUMMARY OF THE INVENTION

It is therefore an object of the present invention to provide an improved method of forming an interconnection structure, in which the release of water vapor from the SOG layer is suppressed and a good contact between the first and second conductive layers is assured.

According to a first aspect of the present invention, there is provided a method of forming an interconnection structure, said method comprising the following steps in the sequence:
  (a) depositing an insulating layer containing a moisture absorbing material on a first conductive layer which is formed on a substrate;
  (b) forming a through-hole by opening said insulating layer so as to expose an upper surface of said first conductive layer;
  (c) heating said substrate, said first conductive layer and said insulating layer at a first temperature; and
  (d) depositing a second conductive layer on said insulating layer at a second temperature which is lower than the first temperature so as to fill said through-hole with said second conductive layer.

According to a second aspect of the present invention, there is provided a method of forming an interconnection structure, said method comprising the following steps in the sequence:
  (a) depositing an insulating layer containing a moisture absorbing material on a first conductive layer which is formed on a substrate;
  (b) forming a through-hole by opening said insulating layer so as to expose two opposed surfaces of said insulating layer and an upper surface of said first conductive layer;
  (c) forming a metal layer on said through-hole so as to mask the two opposed surfaces of said insulating layer; and
  (d) depositing a second conductive layer on said insulating layer so as to fill said through-hole with said second conductive layer.

According to a third aspect of the present invention, there is provided a method of forming an interconnection structure, said method comprising the following steps in the sequence:
  (a) depositing an insulating layer containing a moisture absorbing material on a first conductive layer which is formed on a substrate;
  (b) forming a through-hole by opening said insulating layer so as to expose two opposed surfaces of said insulating layer and an upper surface of said first conductive patterned layer;
  (c) subjecting the upper surface of said first conductive layer to sputter etching so as to form a masking film on the two opposed surfaces of said insulating layer; and
  (d) depositing a second conductive layer on said insulating layer so as to fill said through-hole with said second conductive layer.

DESCRIPTION OF THE PREFERRED EMBODIMENTS

Figure 9:
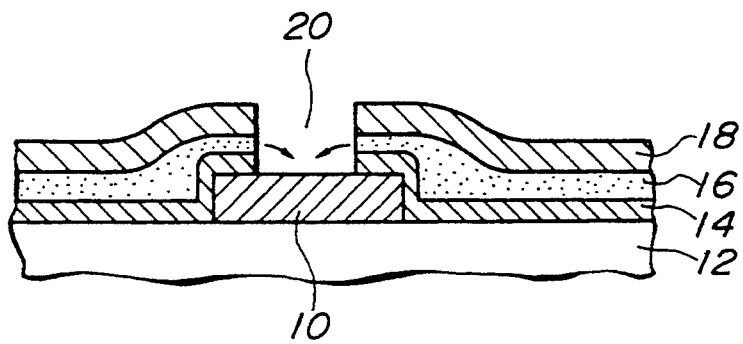
FIG. 9 is a view similar to FIG. 1, but showing a conventional step of forming an interconnection structure.
Figure 1:
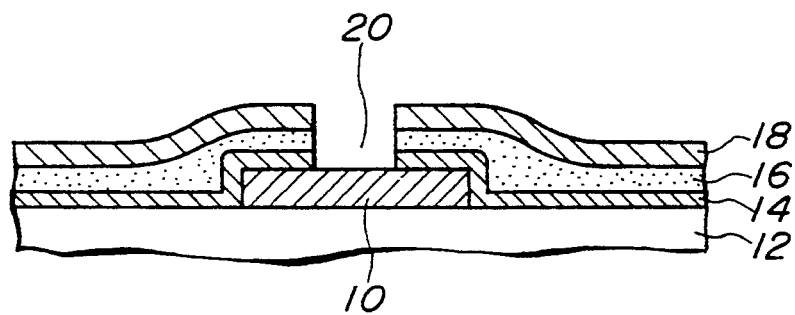
FIGS. 1 and 2 are elevational and sectional views, showing sequential steps of forming an interconnection structure in accordance with a first embodiment of the present invention.
Figure 2:
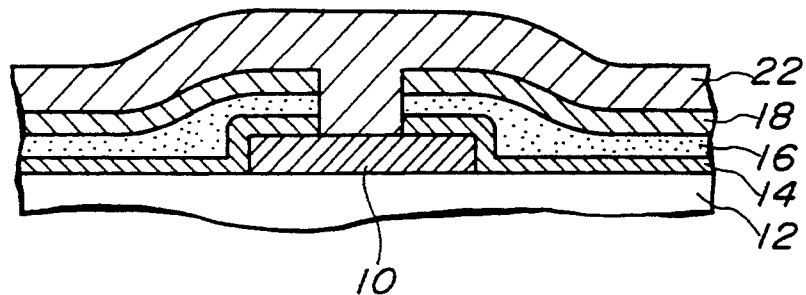

Referring to FIGS. 1 and 2, a method of forming an interconnection structure in accordance with a first embodiment of the present invention will be described. This method comprises the following steps in the sequence.

First, a first aluminum conductive layer 10 is deposited on a substrate 12, followed by the deposition of a first P—$SiO_2$ layer 14 on the first aluminum layer 10 by the plasma CVD method. Then, a SOG layer 16 for planarization is deposited on the first P—$SiO_2$ layer 14, followed by the deposition of a second P—$SiO_2$ layer 18 on the SOG layer 16. The first P—$SiO_2$ layer 14, the SOG layer 16 and the second P—SiO$_2$ layer. 18 serve as insulating films. Then, a through-hole 20 is formed on the interconnection structure so as to expose an upper surface of the first aluminum layer 10 through lithography and dry etching techniques. Then, the interconnection structure is heated at a first temperature. This heating is conducted, for example, to remove moisture which is adsorbed to the interconnection structure during conveyance. In general, the first temperature ranges from 150° to 200° C. However, according to the present invention, the heating is conducted at a relatively high temperature so as to remove water vapor from the SOG layer 16 as much as possible. In case that aluminum is used for the first and second conductive layers, the first temperature preferably ranges from 450° to 550° C. After the heating, the surface of the interconnection structure is subjected to the inverse sputter etching. Then, as is seen from FIG. 2, Al1% Si is deposited on the interconnection structure by sputtering at a second temperature so as to fill the through-hole 20 with the same and to form the aluminum second layer 22 on the second P—SiO$_2$ layer 18. According to the first embodiment of the present invention, it is necessary that the second temperature is not higher than the first temperature. Under this condition, the release of water vapor upon sputtering of the second aluminum layer 22 can be prevented or at least minimized.

Figure 3:
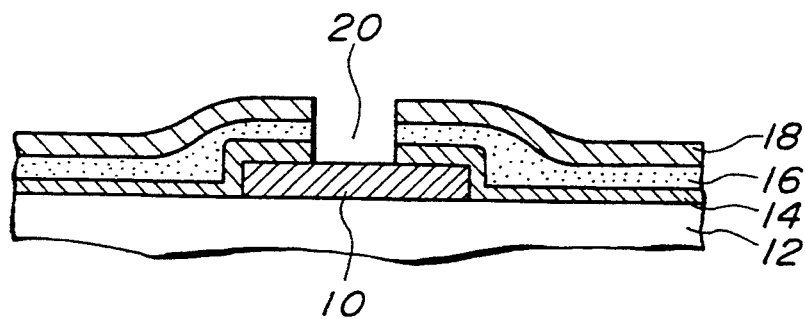
FIGS. 3 to 5 are views similar to FIGS. 1 and 2, but showing a second embodiment of the present invention.
Figure 4:
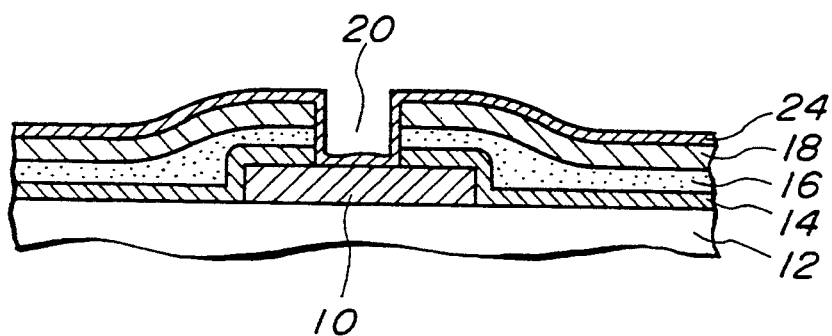
Figure 5:
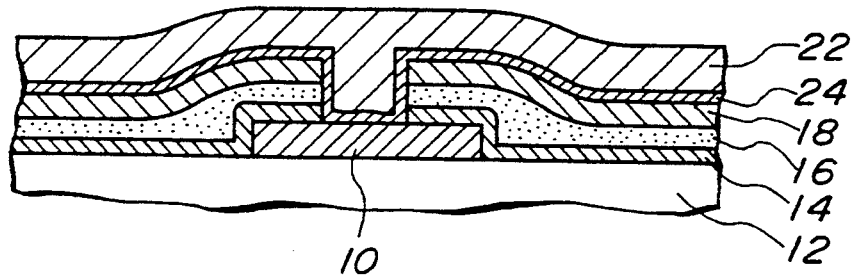

Referring to FIGS. 3 to 5, a method of forming an interconnection structure in accordance with a second embodiment of the present invention will be described. This method comprises the following steps in the sequence.

Similar to the first embodiment, an interconnection structure having a first aluminum conductive layer 10, a first P—SiO$_2$ layer 14, a SOG layer 16 and a second P—SiO$_2$ layer 18 is formed. Then, as is seen from FIG. 3, a through-hole 20 is formed by lithography and dry etching techniques. Then, the interconnection structure is heated at a first temperature ranging from 450° to 550° C. Then, the surface of the interconnection structure is subjected to the inverse sputter etching. Then, as is seen from FIG. 4, titanium (Ti) is deposited on the interconnection structure by sputtering at a second temperature so as to form Ti layer 24 in the through-hole 20 and on the second P—SiO$_2$ layer 18. It is necessary that the second temperature is not higher than the first temperature. In fact, the second temperature ranges from 200° to 300° C. It is preferable that the thickness of the Ti layer 24 is from about 50 to about 200 nm. As long as the thickness of the Ti layer is at least about 50 nm, the Ti layer 24 will become uniform in composition. Furthermore, even if a portion of the Ti layer 24, which is in contact with the insulating layer, is oxidized, another portion of the Ti layer, which is in contact with a second aluminum conductive layer 22 will not be oxidized. Therefore, a good contact is maintained. As long as the thickness of the Ti layer 24 is not thicker than about 200 nm, a sufficient contact area between the first and second aluminum conductive layers 10, 22 can be assured. Then, as is seen from FIG. 5, Al-1% Si is deposited on the Ti layer 24 by sputtering at a third temperature so as to form the second aluminum conductive layer 22. Even if the third temperature is higher than the first temperature, the release of water vapor from the SOG layer 16 is suppressed by the Ti layer 24, thereby assuring a good contact.

In the present invention, Ti is used as a mere example of materials for masking the SOG layer. Thus, as another example, W, Ta or TiW may be used to suppress the release of water vapor from the SOG layer 16.

To evaluate the effect of the heating at the first temperature, a so-called filling percentage of the through-hole with respect to the interconnection structures according to the second embodiment was examined. The results are shown in Table. The filling percentage is defined as the number of through-holes which have been completely filled with the second aluminum conductive layer per one hundred through-holes. The thicknesses of the first P—SiO$_2$ layer 14, the SOG layer 16 and the second P—SiO$_2$ layer 18 were 100 nm, 200 nm and 100 nm, respectively. After the deposition of the SOG layer 16, it was cured at a temperature of 400° C. In Table, the sample numbers 2Ca, 2Cb, 2Cc, 2Ea, 2Eb and 2Ec correspond to the samples which were subjected to the heating at the first temperature, and the sample numbers 1Ca, 1Cb, 1Cc, 1Ea, 1Eb and 1Ec correspond to the samples which were not subject the heating at the first temperature. The sample numbers 2Ca, 2Cb, 2Cc, 1Ca, 1Cb and 1Cc correspond to the through-holes positioned at a central portion of the wafer. The sample numbers 2Ea, 2Eb, 2Ec, 1Ea, 1Eb and 1Ec correspond to the through-holes positioned at an edge portion of the wafer. The sample numbers 2Ca, 2Ea, 1Ca and 1ea correspond to the through-holes having a diameter of about 0.6 µm. The sample numbers 2Cb, 2Eb, 1Cb and 1Eb correspond to the through-holes having a diameter of about 0.8 µm. The sample numbers 2Cc, 2Ec, 1Cc and 1Ec correspond to the through-holes having a diameter of about 1.0 µm. With reference to Table, it is understood the sample numbers 2Ca, 2Cb, 2Cc, 2Ea, 2Eb and 2Ec have high filling percentages. That is, the filling percentage is high in case that the interconnection structures are subjected to the heating at the first temperature prior to the Ti layer deposition. Thus, according to the second embodiment of the present invention, it is preferable to heat the interconnection structure at the first temperature.

Figure 6:
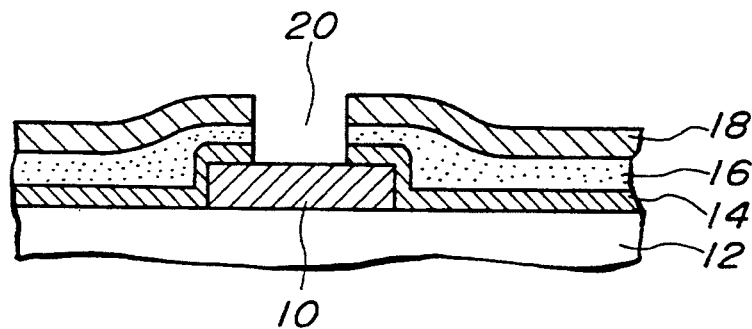
FIGS. 6 to 8 are views similar to FIGS. 1 and 2, but showing a third embodiment of the present invention.
Figure 7:
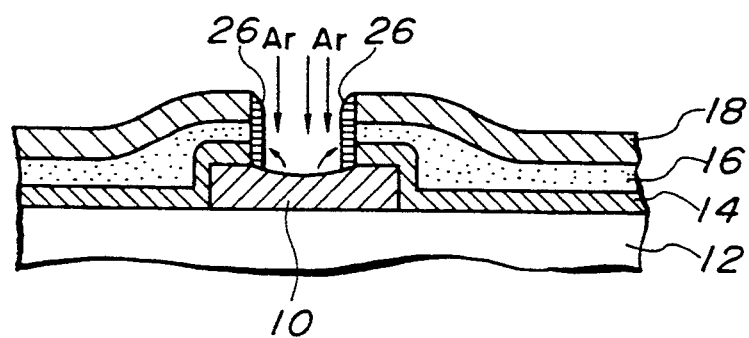
Figure 8:
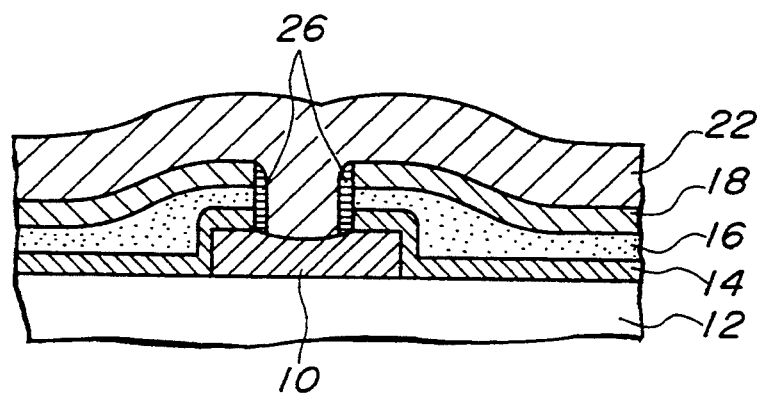

Referring to FIGS. 6 to 8, a method of forming an interconnection structure in accordance with a third embodiment of the present invention will be described. This method comprises the following steps in the sequence.

Similar to the first embodiment, an interconnection structure having a first aluminum conductive layer 10, a first P—SiO$_2$ layer 14, a SOG layer 16 and a second P—SiO$_2$ layer 18 is formed. Then, as is seen from FIG. 6, a through-hole 20 is formed by lithography and dry etching techniques. An upper surface of the first aluminum layer 10 is turned into Al$_2$O$_3$ layer by the exposure to the atmosphere. Then, as is seen from FIG. 7, the interconnection structure is subjected to the sputter etching with, for example, argon (Ar) so as to remove Al$_2$O$_3$ from the upper surface of the first aluminum layer 10 and to form an aluminum masking layer 26 on a side wall of the through-hole 20. This aluminum masking layer 26 is formed by the collision of Ar ions on the first aluminum layer 10. It suffices to have a thickness of the aluminum masking layer 26 ranging from 10 to 100 nm. With the sputter etching, the exposed surface of the first aluminum layer is cleaned. As is seen from FIG. 8, after the formation of the aluminum masking layer 26, a second aluminum conductive layer 22 is formed on the second P—SiO$_2$ layer 18 by sputtering so as to fill the through-hole 20 with the same. The aluminum masking layer 26 serves to suppress the release of water vapor from the SOG layer 16 during the formation of the second aluminum layer 22. Therefore, the increase of contact resistance of the interconnection structure can be suppressed.

In the present invention, the material of the first and second conductive layers 10, 22 is not limited to aluminum. In the present invention, the two insulating layers are not limited to P—SiO$_2$ layers. Thus, another material such as P-SiN$_x$ may be employed for the two insulating layers. In the present invention, the moisture absorbing material is not limited to SOG. Thus, another material such as PSG or BPSG may be employed.

TABLE

| Sample No. | Filling Percentage (%) |
|---|---|
| 2Ca | 100 |
| 2Cb | 100 |
| 2Cc | 100 |
| 2Ea | 95.7 |
| 2Eb | 100 |
| 2Ec | 100 |
| 1Ca | 81.8 |
| 1Cb | 75.6 |
| 1Cc | 92.2 |
| 1Ea | 4.3 |
| 1Eb | 5.6 |
| 1Ec | 41.8 |

What is claimed is:

1. A method of manufacturing a semiconductor device with multi-layer interconnections, comprising the steps in the sequence:

forming a first conductive interconnection layer on a substrate;

depositing an interlayer insulating layer containing a moisture absorbing material layer on the first conductive interconnection layer;

forming a through-hole in the interlayer insulating layer so as to expose a surface of the first conductive interconnection layer;

heating the substrate at a first temperature depositing a metal layer in the through-hole on the exposed first conductive interconnection layer and on the interlayer insulating layer while heating the substrate at a second temperature which is lower than the first temperature; and forming a second conductive interconnection layer on the metal layer by sputtering to connect the first conductive interconnection layer and the second conductive interconnection layer.

2. A method according to claim 1, wherein said second conductive interconnection layer comprises an aluminum-based material.

3. A method according to claim 1, wherein said metal layer comprises titanium.

4. A method according to claim 1, wherein said first temperature is in the range of 450° C. to 550° C.

5. A method of manufacturing a semiconductor device with multi-layer interconnections, comprising the steps in the sequence:

forming a first conductive interconnection layer on a substrate;

depositing an interlayer insulating layer containing a moisture absorbing material layer on the first conductive interconnection layer;

forming a through-hole in the interlayer insulating layer so as to expose a surface of the first conductive interconnection layer;

heating the substrate at a temperature range of 450° C. to 550° C.; forming metal films on the side walls of the through-hole by sputtering the exposed surface of the first conductive interconnection layer while heating the substrate at a second temperature which is lower than the first temperature; and depositing a second conductive interconnection in the through-hole and on the interlayer insulating layer to connect the first and second interconnection, layers.

* * * * *